United States Patent
Lin et al.

(10) Patent No.: US 11,854,849 B2
(45) Date of Patent: Dec. 26, 2023

(54) METHOD FOR OPERATING CONVEYING SYSTEM

(71) Applicant: TAIWAN SEMICONDUCTOR MANUFACTURING COMPANY LTD., Hsinchu (TW)

(72) Inventors: Yong-Jyu Lin, Hsinchu (TW); Fu-Hsien Li, Taichung (TW); Chen-Wei Lu, Hsinchu (TW); Chi-Feng Tung, Miaoli County (TW); Hsiang Yin Shen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 419 days.

(21) Appl. No.: 16/900,555

(22) Filed: Jun. 12, 2020

(65) Prior Publication Data
US 2021/0391201 A1    Dec. 16, 2021

(51) Int. Cl.
*H01L 21/67* (2006.01)
*H01L 21/677* (2006.01)
(Continued)

(52) U.S. Cl.
CPC ...... *H01L 21/67733* (2013.01); *B65G 1/0457* (2013.01); *B66C 13/23* (2013.01);
(Continued)

(58) Field of Classification Search
CPC ......... H01L 21/67733; H01L 21/67259; H01L 21/67724; H01L 21/6773; H01L 21/67736;
(Continued)

(56) References Cited

U.S. PATENT DOCUMENTS 4,174,921 A * 11/1979 Teodorescu ............ B65G 51/26
                                                        104/138.1
2008/0310939 A1* 12/2008 Ku ..................... H01L 21/67775
                                                        414/935
(Continued)

FOREIGN PATENT DOCUMENTS

TW       200832599 A     8/2008
TW       201641412 A    12/2016
(Continued)

OTHER PUBLICATIONS

Office action, Cited References and Search report dated Sep. 28, 2021 issued by the Taiwan Intellectual Property Office (TIPO) for the Taiwanese counterpart application No. 110100278.

*Primary Examiner* — Mohammed Shamsuzzaman
(74) *Attorney, Agent, or Firm* — WPAT LAW; Anthony King

(57) ABSTRACT

A method for operating a conveying system is provided. An overhead hoist transport (OHT) vehicle is provided, wherein the OHT vehicle includes a gripping member configured to grip and hold a carrier, and a receiver configured to receive a signal. The signal is transmitted to the receiver of the OHT vehicle. The OHT vehicle is moved toward the carrier, and the carrier is gripped by the gripping member of the OHT vehicle. A lifting force is determined based on a weight of a carrier, a number of workpieces in the carrier, or a vertical distance between the OHT vehicle and the carrier, and the lifting force is applied to the carrier.

12 Claims, 16 Drawing Sheets

(51) Int. Cl.
  *B65G 1/04*    (2006.01)
  *B66F 9/18*    (2006.01)
  *B66C 13/48*   (2006.01)
  *B66C 19/00*   (2006.01)
  *B66C 13/23*   (2006.01)
  *B61B 3/00*    (2006.01)

(52) U.S. Cl.
  CPC .............. *B66C 13/48* (2013.01); *B66C 19/00* (2013.01); *B66F 9/183* (2013.01); *H01L 21/6773* (2013.01); *H01L 21/67259* (2013.01); *H01L 21/67724* (2013.01); *H01L 21/67736* (2013.01); *B61B 3/00* (2013.01); *B65G 2201/0297* (2013.01)

(58) Field of Classification Search
  CPC ......... H01L 21/67253; H01L 21/67288; H01L 21/67766; B65G 1/0457; B65G 2201/0297; B66C 13/23; B66C 13/48; B66C 19/00; B66F 9/183; B61B 3/00
  See application file for complete search history.

(56) References Cited

U.S. PATENT DOCUMENTS

| | | | |
|---|---|---|---|
| 2010/0279438 A1* | 11/2010 | An | H01L 21/67265 414/222.01 |
| 2020/0243363 A1* | 7/2020 | Yuasa | H01L 21/67724 |

FOREIGN PATENT DOCUMENTS

| | | | | |
|---|---|---|---|---|
| WO | WO-2007132650 A1 | * | 11/2007 | ............... B65G 1/00 |
| WO | WO-2014115472 A1 | * | 7/2014 | ............. B66C 13/08 |

* cited by examiner

METHOD FOR OPERATING CONVEYING SYSTEM

BACKGROUND

The semiconductor industry has experienced exponential growth, and integrated circuits (ICs) are used in a wide variety of applications. ICs are typically manufactured by automated or semi-automated equipment. Workpieces, such as substrates or wafers, are loaded into the equipment, and electrical components and circuitries are then fabricated over or within the workpieces through numerous manufacturing operations.

Automated Material Handling Systems (AMHS) have been widely used in semiconductor fabrication to automatically handle and transport groups of the workpieces between various processing instruments. There are numerous types of automated vehicles (including automated guided vehicles (AGV), rail-guided vehicles (RGV), overhead hoist transport (OHT), and the like) for moving and transporting carriers (such as front-opening unified pods (FOUPs)) carrying the workpieces during fabrication. For example, an OHT system includes automatically-moving OHT vehicles carrying workpieces from a load port of one processing instrument to a load port of another processing instrument.

There is a continuous need to modify the manufacturing operations and improve efficiency of transport of the workpieces between the processing instruments, such as reducing power consumption during transport of different types and quantities of the workpieces.

BRIEF DESCRIPTION OF THE DRAWINGS

Aspects of the present disclosure are best understanding from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
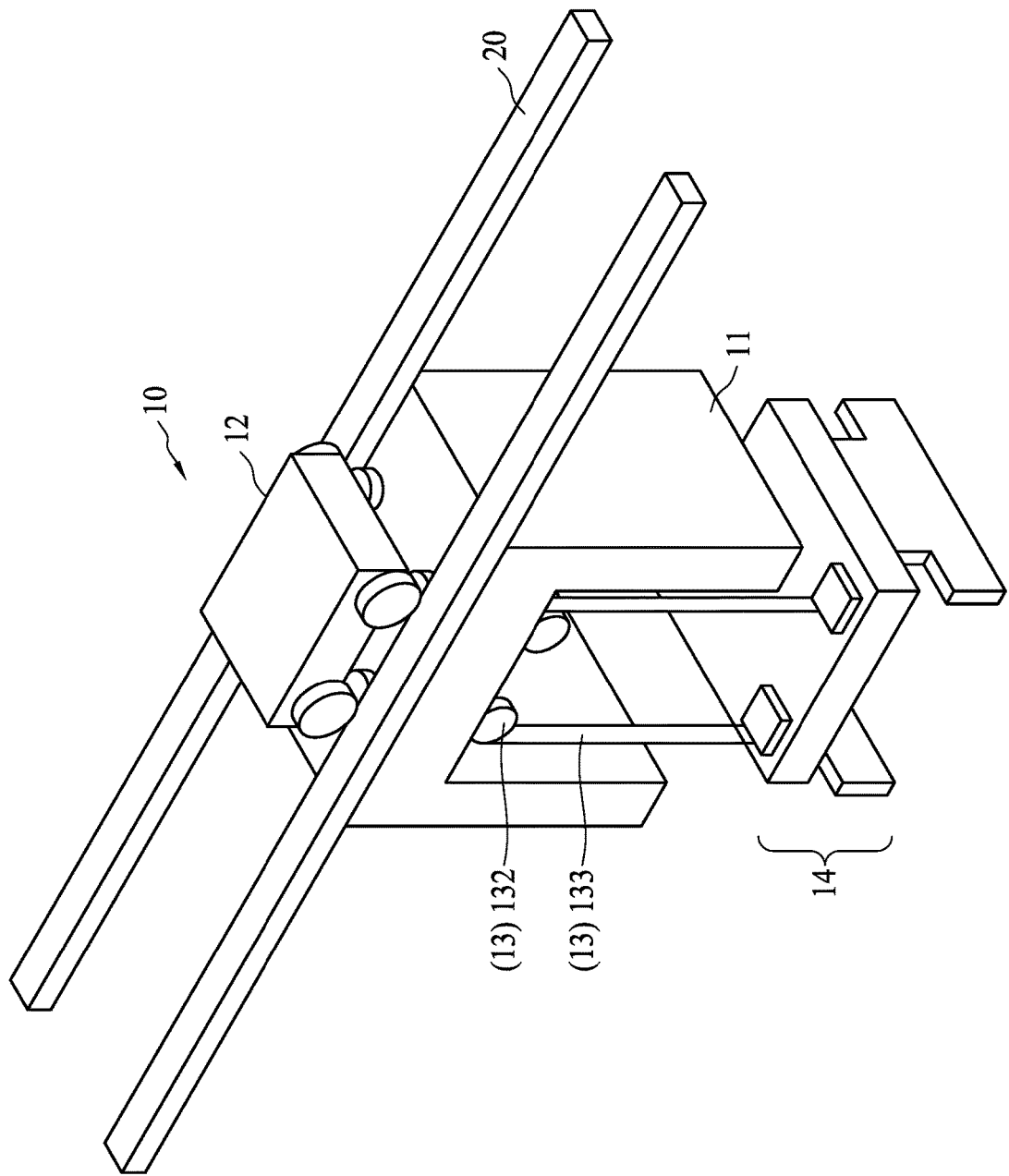
FIG. 1 is a schematic diagram of a conveying system in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A conveying system is utilized during semiconductor fabrication. The conveying system includes a conveying unit configured to travel along a rail and carry a workpiece or a semiconductor structure from one processing machine to another. The conveying unit is able to lift a carrier for carrying semiconductor structures or workpieces from a load port of a machine station and move the carrier along the rail to another machine station. The conveying unit provides a constant force to ensure all carriers with different weights can be lifted and held safely by the conveying unit during transportation. Normally, the carrier should be unlocked from the load port prior to being lifted by the conveying unit; however, when a carrier is abnormally locked to the load port, the force may still be applied to the abnormally-locked carrier by the conveying unit, which can result in damage to the semiconductor structures or the workpieces in the carrier, damage to the load port, and/or damage to the carrier.

The present disclosure therefore provides a method for operating a conveying system including an automatic calculating operation to adjust a minimum force to lift a carrier. The minimum force can be calculated based on information of a weight of the carrier, a number of workpieces or semiconductor substrates in the carrier, a weight of each of the workpieces or semiconductor substrates, and/or a vertical distance between an overhead hoist transport (OHT) vehicle and the carrier. Minimum forces required to lift different carriers after different stages of the semiconductor fabrication can be different, and the conveying system of the present disclosure is able to adjust lifting forces applied to different carriers. Therefore, damage to the semiconductor substrates, the workpieces, the carrier and the load port during the lifting process can be prevented.

Figure 2:
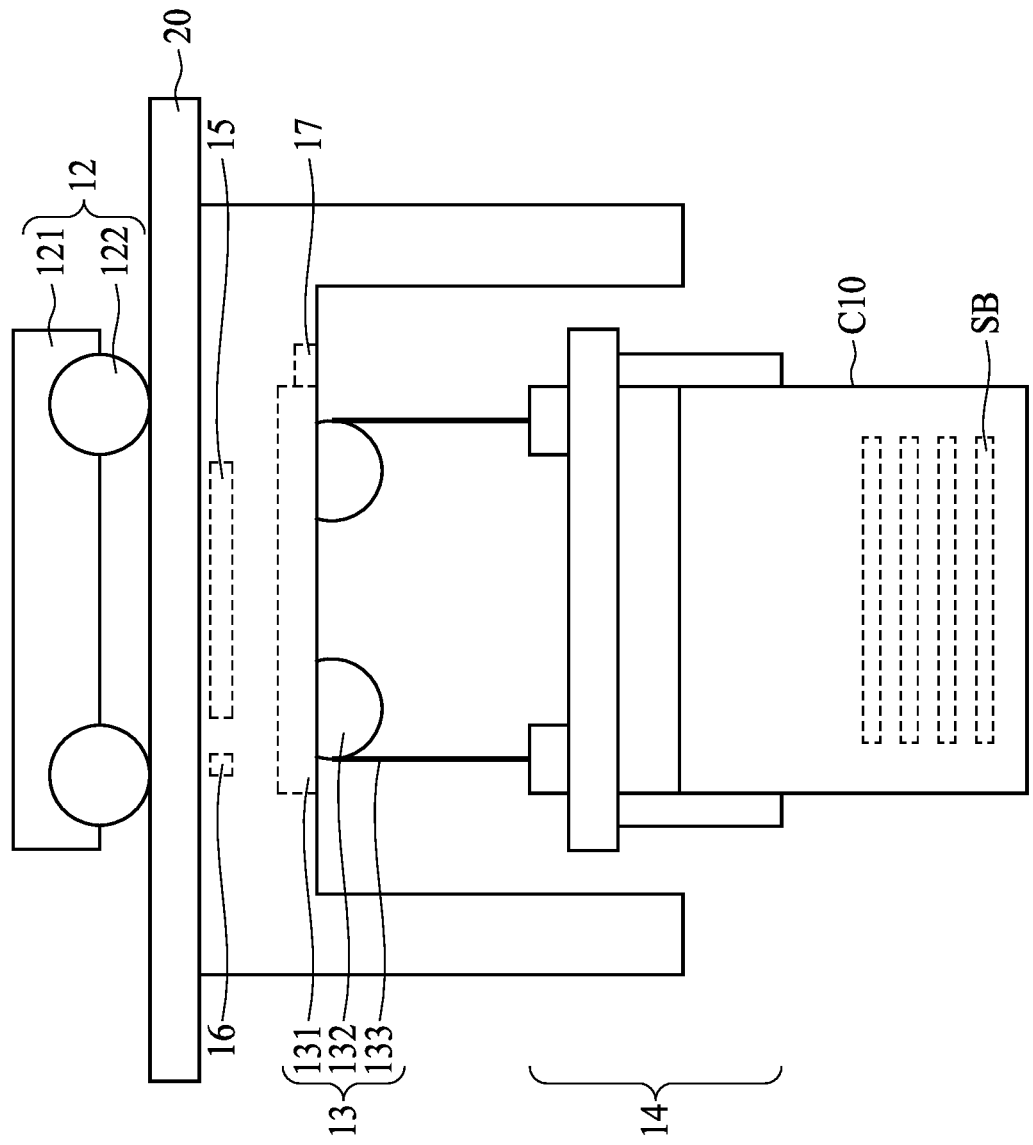
FIG. 2 is a cross-sectional diagram of the conveying system shown in FIG. 1 showing a configuration when the conveying system moves a carrier in accordance with some embodiments of the present disclosure.

FIG. 1 is a schematic diagram of a conveying system S10 in accordance with various embodiments of the present disclosure. The conveying system S10 functions to transport a carrier between locations during a semiconductor fabrication in a factory. FIG. 2 is a cross-sectional schematic diagram illustrating the conveying system S10 of FIG. 1 carrying a first carrier C10. In some embodiments, the conveying system S10 is an overhead hoist transport (OHT) system. The conveying system S10 includes an OHT vehicle 10 and a rail 20. The OHT vehicle 10 is configured to carry the first carrier C10 and travel along the rail 20. In some embodiments, the OHT vehicle 10 can include a housing 11, a travelling member 12, a hoisting member 13 and a gripping member 14.

The travelling member 12 is configured to moveably mount the OHT vehicle 10 to the rail 20. In some embodiments, the travelling member 12 can be a wheeled trolley, which is configured to complement and cooperate with the rail 20 for rolling movement along the rail 20 laterally or horizontally. In other words, the OHT vehicle 10 is suspended on the rail 20 through the travelling member 12. In some embodiments, the travelling member 12 is installed on the rail 20 and connected to the housing 11. In some embodiments, the housing 11 is mounted on the travelling member 12. The travelling member 12 may include a travelling motor 121 and one or more wheels 122. The OHT vehicle 10 travels laterally upon rotation of the wheel 122 of the travelling member 12. In some embodiments, the travelling motor 121 is configured to actuate the wheel 122 such that the wheel 122 can be rotated and the OHT vehicle 10 can travel laterally along the rail 20.

In some embodiments, the housing 11 of the OHT vehicle 10 can be a rigid frame surrounding several components, such as the hoisting member 13 and the gripping member 14. The first carrier C10 can be a FOUP, a standard mechanical interface (SMIF) pod, or the like. In some embodiments, the gripping member 14 is configured to grip the first carrier C10 for carrying the workpiece SB. In some embodiments, the workpiece SB can be a wafer, a semiconductor substrate, a semiconductor structure or a package. In some embodiments, the workpiece SB includes semiconductive materials such as silicon and/or other suitable materials. In some embodiments, the workpiece SB includes circuitries or electrical components disposed on a semiconductor substrate. In some embodiments, a lot or a group of workpieces SB are disposed inside the first carrier C10 to isolate the workpieces SB from the surrounding environment and prevent contamination.

In some embodiments, the gripping member 14 is configured to securely hold and release the first carrier C10 in order to transport the workpiece SB along the rail 20 from one location to another. In some embodiments, the gripping member 14 is connected to the housing 11 through the hoisting member 13. In some embodiments, the gripping member 14 can hold the first carrier C10 inside and outside the housing 11 using the hoisting member 13.

The hoisting member 13 is configured to lift and lower the first carrier C10 from and to a load port of a process machine station using the gripping member 14. In some embodiments, when the hoisting member 13 is in a retracted status, the hoisting member 13 is disposed in and surrounded by the housing 11. In some embodiments, when the hoisting member 13 is in an extended status, the hoisting member 13 is disposed out of the housing 11. The hoisting member 13 is extendable from and retractable toward the housing 11. In some embodiments, the hoisting member 13 connects the housing 11 to the gripping member 14. In some embodiments, the hoisting member 13 is extendable to move the gripping member 14 out of the housing 11 and retractable to move the gripping member 14 back to the housing 11. In some embodiments, the hoisting member 13 is telescopically extendable and retractable.

In some embodiments, the hoisting member 13 includes a hoisting motor 131, at least a wheel 132 and at least a belt 133. The hoisting motor 131 is configured to actuate the wheel 132 such that the wheel 132 can be rotated and the belt 133, which is connected to the wheel 132, can be vertically extended from or retracted toward the wheel 132. The hoisting member 13 can lower the gripping member 14 by extending the belt 133 from the housing 11. A top portion of the first carrier C10 can then be held by the gripping member 14 and lifted from a load port of a processing machine station by retracting the belt 133 toward the housing 11. In some embodiments, when the belt 133 is in a retracted status, the hoisting member 13, the gripping unit 14 and the carrier C10 are disposed inside the housing 11. In some embodiments, the hoisting member 13 is in the retracted status upon movement of the OHT vehicle 10 along the rail 20.

In order to automatically adjust a lifting force applied to the first carrier C10, the OHT vehicle 10 can further include a control unit 15 installed on the housing 11. The configuration shown in FIG. 2 is provided for illustration purpose, and a specific location of the control unit 15 on the housing 11 is not limited herein. The control unit 15 is configured to calculate and determine a lifting force to be applied to the first carrier C10, wherein the lifting force is a minimum force required to lift the first carrier C10 based on information of the first carrier C10 received by the control unit 15. In some embodiments, data is transmitted to the OHT vehicle 10 through wireless or wired electrical signals, and the data includes information of a weight of the first carrier C10, a number of workpieces SB in the first carrier C10, a weight of each of the workpieces SB in the first carrier C10, and/or a vertical distance between the OHT vehicle 10 and the first carrier C10. In some embodiments, the OHT vehicle 10 can further include a receiver 16 installed on the housing 11. The configuration shown in FIG. 2 is provided for illustration purpose, and a specific location of the receiver 16 on the housing 11 is not limited herein. The receiver 16 is electrically connected to the control unit 15. In some embodiments, the receiver 16 can be installed in the control unit 15 or separated from the control unit 15 on the housing 11. The signal including the information of the first carrier C10 is received by the receiver 16 and then processed by the control unit 15.

In some embodiments, a torque is calculated by the control unit 15 based on the data or the information of the first carrier C10. The control unit 15 then sends a signal including the torque to the hoisting motor 131 of the hoisting member 13. After the gripping member 14 grips the first carrier C10, the hoisting motor 131 of the hoisting member 13 generates the torque, which is calculated by the control unit 15, to actuate rotation of the wheels 132 to retract the belt 133. The hoisting motor 131 generates the torque to drive the wheel 132 and retract the belt 133 and thus convert the torque to the lifting force. In other words, the torque is applied to an axis of the wheel 132 to turn the wheel 131, and the belt 133 converts the torque to the lifting force applied to the first carrier C10 through the gripping member 14, wherein the lifting force is an upward force for raising the first carrier C10.

Under normal circumstances, the first carrier C10 can be lifted by the lifting force. However, in an abnormal circumstance, such as when the first carrier C10 is abnormally locked to a load port, the first carrier C10 cannot be lifted by the lifting force determined by the control unit 15 due to a downward force on the first carrier C10 from the load port. In some embodiments, under the abnormal circumstance, the conveying system S10 will stop providing the lifting force to the first carrier C10. In some embodiments, the conveying system S10 can detect the abnormal circumstance and send a signal or an alert to notify the operator that an abnormal circumstance exists. In some embodiments, the OHT vehicle 10 further includes a sensor 17 to detect whether the first carrier C10 is lifted. The sensor can be installed on the housing 11 and electrically connected to the hoisting motor 131, but the disclosure is not limited thereto. In some embodiments, the sensor 17 is installed on the load port and electrically connected to the control unit 15 in order to notify the operator about the lifting of the first carrier C10.

Figure 3:
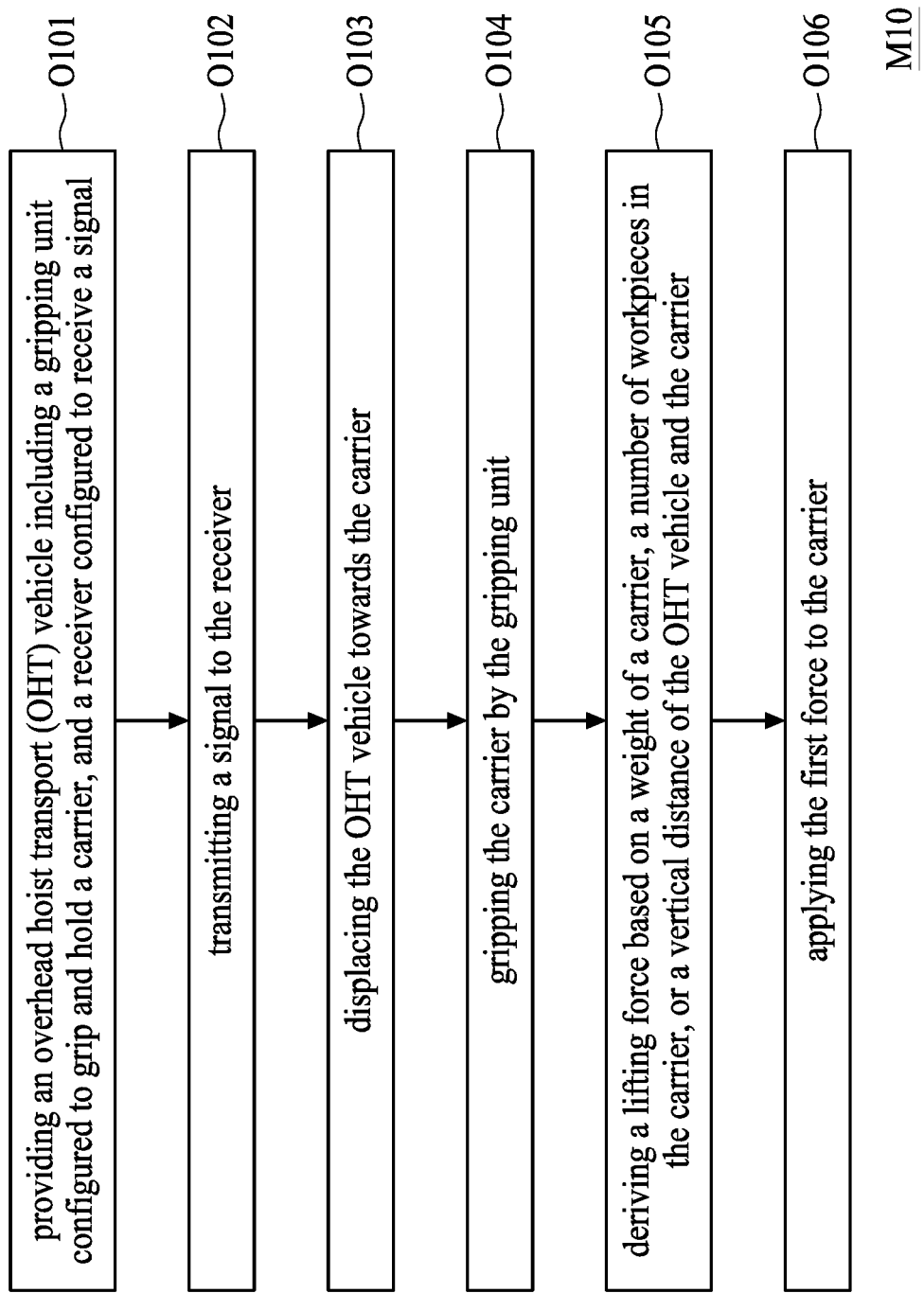
FIG. 3 is flow chart of a method for operating the conveying system shown in FIG. 1 in accordance with some embodiments of the present disclosure.

In accordance with the above description, one aspect of the present disclosure also provides a method M10 for operating the conveying system S10. The method M10 includes a number of operations and the description and illustration are not deemed as a limitation as the sequence of the operations. FIG. 3 is a flow chart according to some embodiments of the method M10 for operating the conveying system S10. As shown in FIG. 3, the method M10 includes: (O101) providing an overhead hoist transport (OHT) vehicle including a gripping member configured to grip and hold a carrier, and a receiver configured to receive a signal; (O102) transmitting a signal to the receiver; (O103) moving the OHT vehicle toward the carrier; (O104) gripping the carrier by the gripping member; (O105) determining a lifting force based on a weight of a carrier, a number of workpieces in the carrier, or a vertical distance of the OHT vehicle and the carrier; and (O106) applying the lifting force to the carrier.

Figure 4:
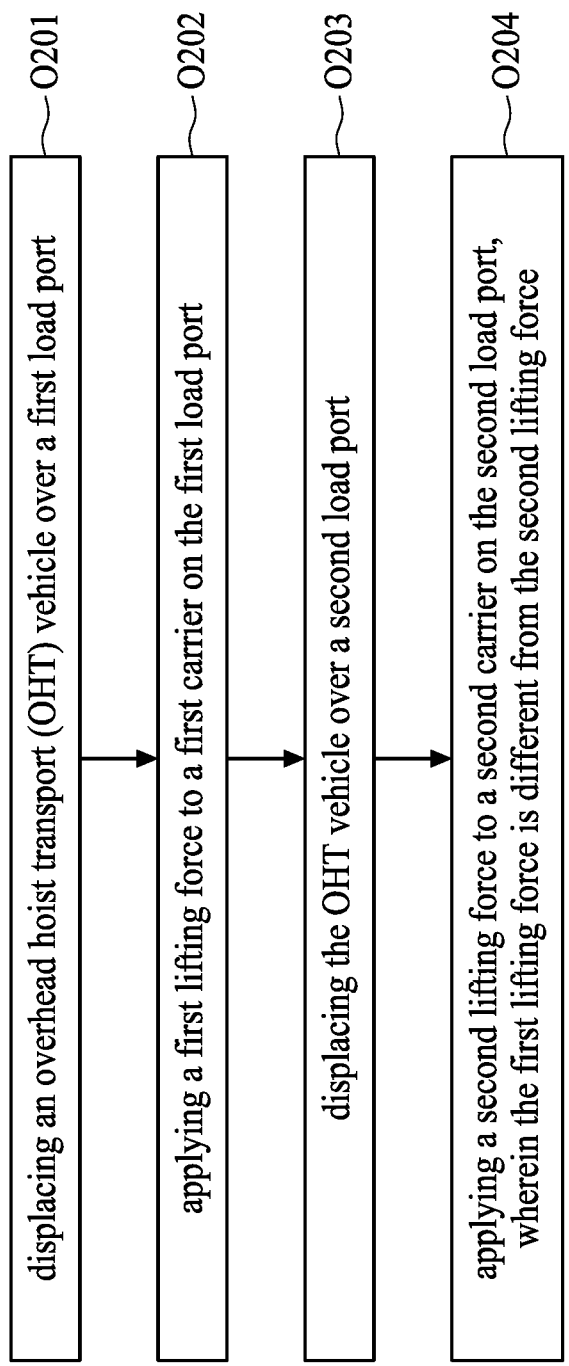
FIG. 4 is flow chart of a method for operating the conveying system shown in FIG. 1 in accordance with some embodiments of the present disclosure.

Another embodiment of the present disclosure provides a method M20 for operating the conveying system S10. The method M20 includes a number of operations and the description and illustration are not deemed as a limitation as the sequence of the operations. FIG. 4 is flow chart according to some embodiments of the method M20 for operating the conveying system S10. As shown in FIG. 4, the method M10 includes: (O201) moving an overhead hoist transport (OHT) vehicle over a first load port; (O202) applying a first lifting force to a first carrier on the first load port; (O203) moving the OHT vehicle over a second load port; and (O204) applying a second lifting force to a second carrier on the second load port, wherein the first lifting force is different from the second lifting force.

Figure 5:
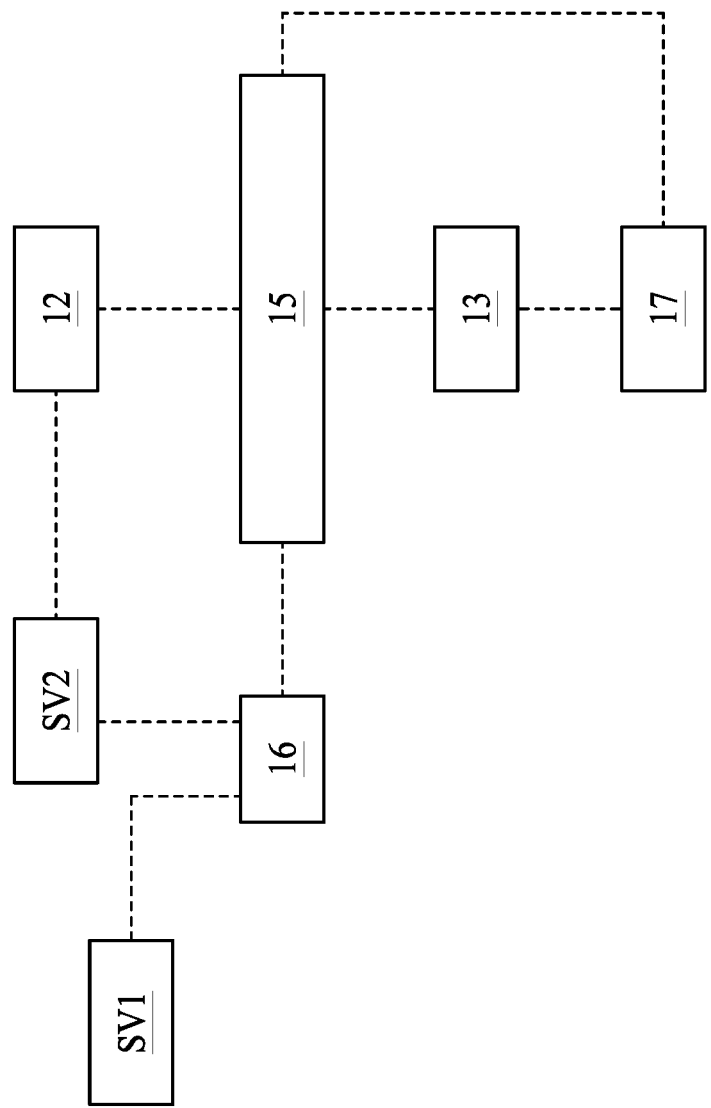
FIG. 5 is a schematic diagram of electrical connections for signal transmission of the conveying system shown in FIG. 1 in accordance with some embodiments of the present disclosure.

In order to further illustrate the method M10 and the method M20 of the disclosure, FIG. 5 shows a schematic diagram of electrical connections for signal transmission, and FIGS. 6 to 15 are diagrams showing different configurations of the conveying system S10 during different operations of the method M10 and the method M20.

In accordance with some embodiments and the operations O101 and O102, the OHT vehicle 10 of the conveying system S10 as shown in FIGS. 1 to 2 is provided, and a first signal or a first data including information of the first carrier C10 is transmitted to the receiver 16. In some embodiments, the information of the first carrier C10 needed for calculating a first torque T1 and/or a first lifting force F1 can be saved in one or more servers or systems, and the receiver 16 is electrically connected to the one or more servers or systems. As shown in FIG. 5, the receiver 16 is electrically connected to a first server SV1 and a second server SV2. Some information of the first carrier C10, such as a type of the first carrier C10, a weight of the first carrier C10, a number of workpieces SB in the first carrier C10, and an ID of the first carrier C10, may be stored in the first server SV1. Some information of the first carrier C10, such as a vertical distance between the OHT vehicle 10 and the first carrier C10, a time schedule for picking up the first carrier C10, a load port at which the first carrier C10 is to be picked up, and a load port at which the first carrier C10 is to be dropped off, may be stored in the second server SV2. The receiver 16 can be integrated with systems or servers already installed in a semiconductor factory.

In the operation O102, one or more signals (or data) including the information for determining the first lifting force F1 is transmitted to the receiver 16. In some embodiments, the signal (or the data) including information of the weight of the first carrier C10 and the number of workpieces SB in the first carrier C10 is transmitted from the first server SV1 to the receiver 16. In some embodiments, the signal (or the data) including information of the vertical distance between the OHT vehicle 10 and the first carrier C10 is transmitted from the second server SV2 to the receiver 16. The signal (or the data) may include more or less of the above-described information according to different applications or a different design, and is not limited herein. In some embodiments, at least one of the weight of the first carrier C10, the number of workpieces SB in the first carrier C10, and the vertical distance of the OHT vehicle 10 and the first carrier C10 is transmitted to the receiver 16.

In some embodiments, the travelling member 12 can be electrically connected to the one or more servers. As shown in FIG. 5, the travelling member 12 is electrically connected to the second server SV2. Some information, such as the time schedule for picking up the first carrier C10, the load port at which the first carrier C10 is to be picked up, and the load port at which the first carrier C10 is to be dropped off, can be transmitted to the travelling member 12 through one or more electrical signals. The travelling member 12 can transport the first carrier C10 from one load port to another load port according to the time schedule. However, it is not intended to limit the disclosure, and, in some embodiments, the travelling member 12 is not electrically connected to the second server SV2 directly, but is instead connected to the second server SV2 through the control unit 15. In some embodiments, information of a transportation schedule is transmitted to the control unit 15, and the travelling member 12 receives a signal from the control unit 15 to perform the movement of the OHT vehicle 10.

Figure 6:
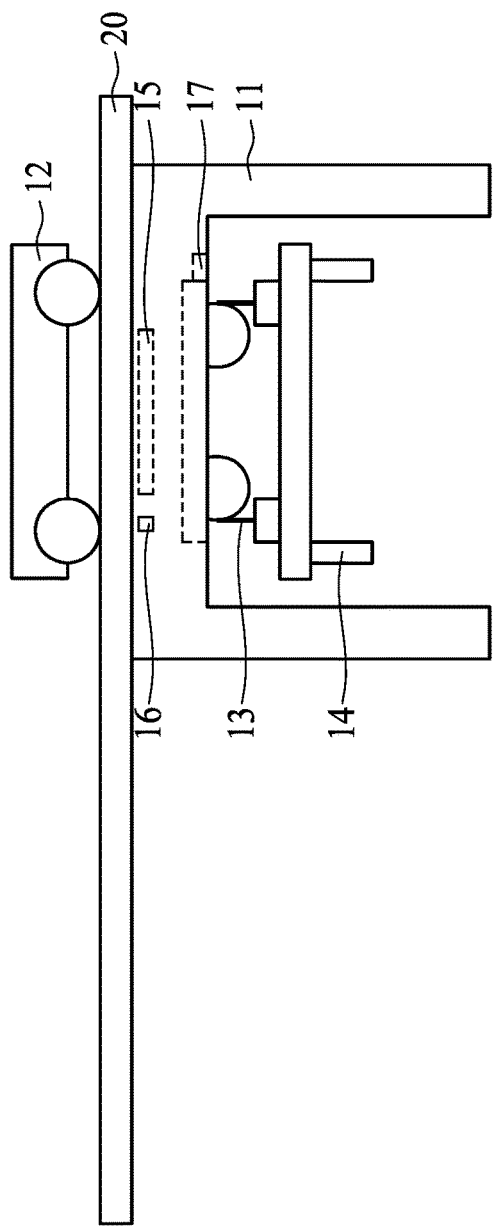
FIGS. 6 to 15 are schematic diagrams showing different configurations of the conveying system while performing different operations of the methods illustrated in FIGS. 3, 4 and 16.
Figure 6:
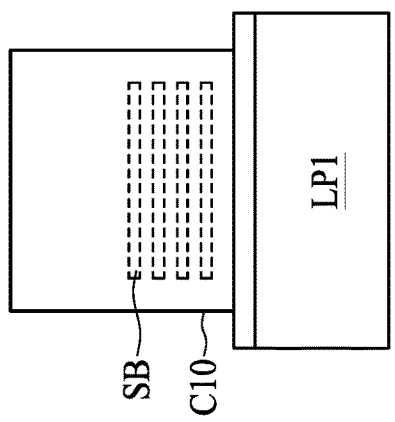

FIG. 6 is a diagram of the conveying system S10 in accordance with some embodiments and the operation O103 or O201. The OHT vehicle 10 is moved toward and displaced or positioned over the first carrier C10 on a first load port LP1 of a machine station. In some embodiments, the travelling member 12 moves the OHT vehicle 10 toward the first load port LP1 according to the information from the second server SV2.

In some embodiments, the method M10 and the method M20 further include extending the hoisting member 13 toward the first carrier C10 after the operation O103 or O201 and prior to the operation O104 or O202. The hoisting motor 131 actuates rotation of the wheels 132 to release the belt 133 in order to lower the gripping member 14 toward the first carrier C10.

Figure 7:
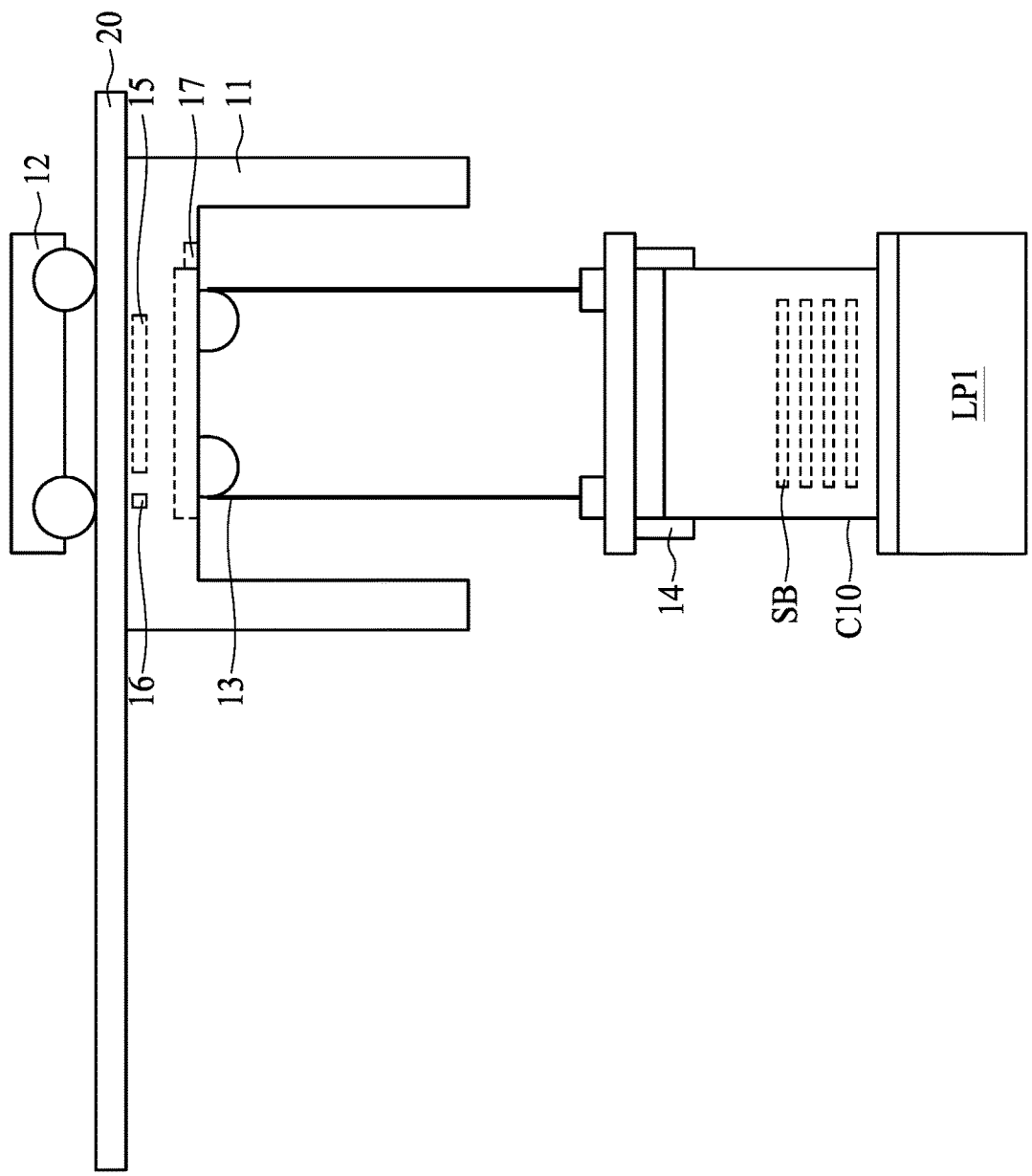

FIG. 7 is a diagram of the conveying system S10 in accordance with some embodiments and the operation O104, wherein the first carrier C10 is gripped by the gripping member 14. In some embodiments, the gripping member 14 applies forces from two opposite sides of the first carrier C10 in order to grip the first carrier C10. However, the disclosure is not limited thereto. In alternative embodiments, the gripping member 14 can include a connector to connect a corresponding connector to the first carrier C10, e.g., on a top of the first carrier C10.

In the operation O105 of the method M10, the first lifting force F1 is determined based on information of the weight of the first carrier C10, the number of workpieces SB in the first carrier C10, or the vertical distance between the OHT vehicle 10 and the first carrier C10. As illustrated above, the first lifting force F1 is determined by the control unit 15 based on the information transmitted from the servers SV1 and SV2. In some embodiments, in order to determine the first lifting force F1 from the information of the signal, a first torque T1 is calculated by the control unit 15 according to the weight of the first carrier C10, the number of workpieces SB in the first carrier C10, or the vertical distance between the OHT vehicle 10 and the first carrier C10. The control unit 15 transmits a signal or a command to generate the first torque T1 to the hoisting motor 131 of the hoisting member 13, and the hoisting motor 131 generates the first torque T1. The first torque T1 is converted to the first lifting force F1 by the belt 133 in order to lift the first carrier C10 and the gripping member 14. In some embodiments, the first lifting force F1 is first calculated and then the first torque T1 is determined by the control unit 15 based on the calculated first lifting force F1. In some embodiments, the first lifting force F1 is calculated based on at least one of the weight of the first carrier C10, the number of workpieces SB in the first carrier C10, and the vertical distance between the OHT vehicle 10 and the first carrier C10. In addition, energy consumption during conversion from the first torque T1 to the first lifting force F1 is also be considered and calculated by the control unit 15 in order to acquire the first torque T1. The first lifting force F1 is designed and calculated to be a minimum force required for lifting the first carrier C10 for a purpose of minimizing power consumption. The operation O105 is performed prior to applying the first lifting force F1 to the first carrier C10 (i.e., the operation O106 of the method M10), and a sequence of the operation O105 relative to operations O101, O102, O103 and O104 is not limited herein. Similarly, the method M20 can further include: determining the first lifting force F1 based on the data including at least one of the weight of the first carrier C10, the number of workpieces SB in the first carrier C10, and the vertical distance between the OHT vehicle 10 and the first carrier C10 prior to the operation O202.

Figure 8:
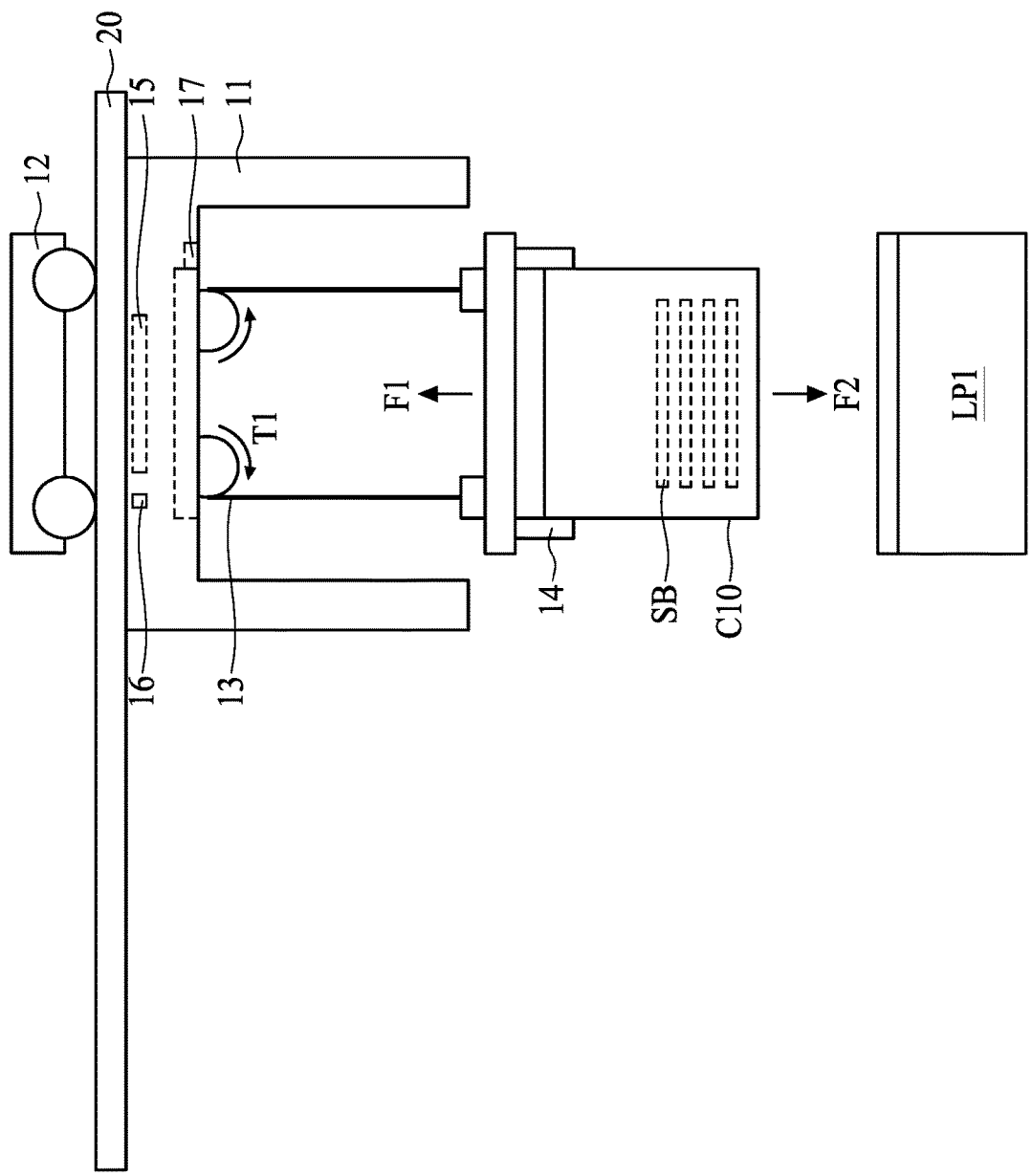
Figure 9:
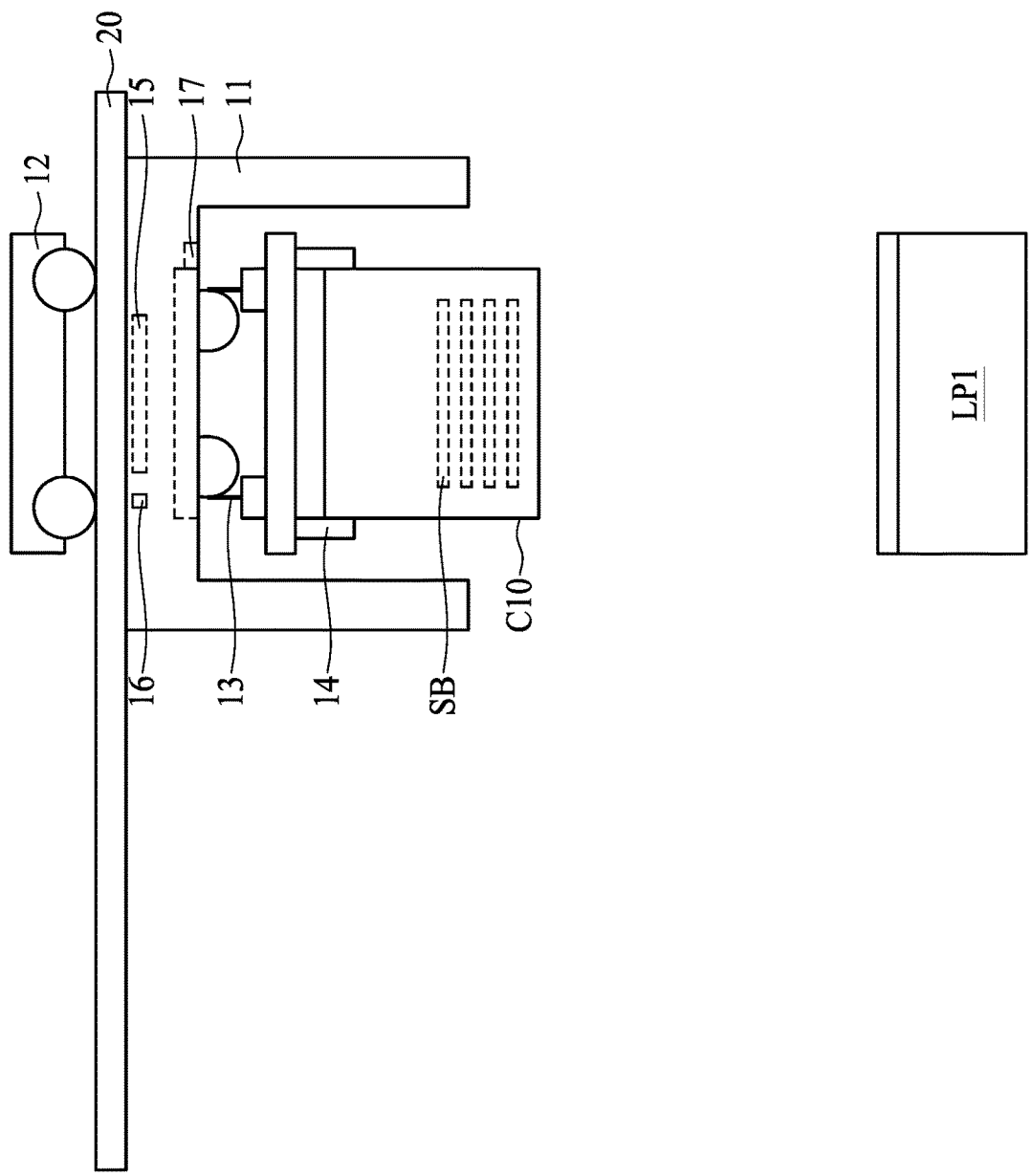

FIGS. 8 and 9 are diagrams of the conveying system S10 in accordance with some embodiments and the operation O106 or O202, and illustrate the first lifting force F1 being applied to the first carrier C10. The first torque T1 is generated by the hoisting motor 131 and is converted to the first lifting force F1 in order to apply an upward force to the first carrier C10 to lift the first carrier C10 from the first load port LP1. After the first lifting force F1 is applied, under normal circumstances, the first carrier C10 is lifted upward from the first load port LP1 with the first lifting force F1, as shown in FIGS. 8 to 9. The hoisting member 13 is retracted back to the housing 11, and the first carrier C10 is held by the gripping member 14 inside the housing 11 during transportation as shown in FIG. 9. In order words, the OHT vehicle 10 may receive a first downward force F2 from the first carrier C10 due to gravity. The first downward force F2 should be substantially equal to a total mass of the first carrier C10 and the workpieces SB inside the first carrier C10, and the first lifting force F1 should be substantially equal to or slightly greater than the first downward force F2. Under normal circumstances, the first carrier C10 may be transferred to a load port of another machine station.

Figure 10:
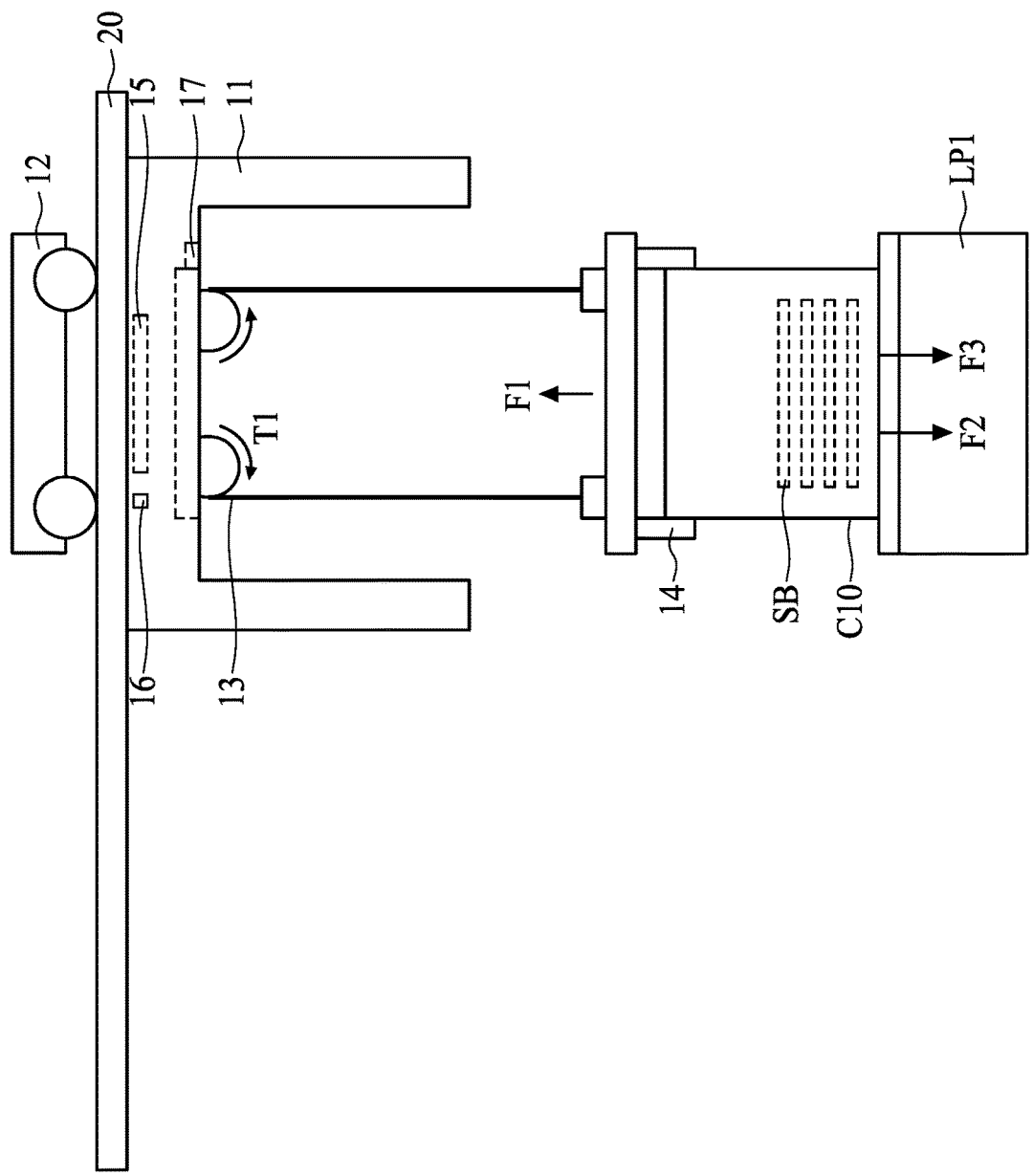

When an abnormal event happens, the first carrier C10 may receive a first downward force F2 from the first load port LP1 as shown in FIG. 10, and the first carrier C10 may not be lifted by the first lifting force F1 from the hoisting member 13. FIG. 10 is a diagram of the conveying system S10 in accordance with some embodiments of the present disclosure. The first carrier C10 is locked to the first load port LP1 when the first carrier C10 is disposed on the first load port LP1, and the first carrier C10 should be released prior to the applying of the first lifting force F1. However, if the first carrier C10 is not released normally or if the first lifting force F1 is applied prior to the release of the first carrier C10, an extra downward force F3 is applied to the first carrier C10, and the OHT vehicle 10 receives both the first downward force F2 and the extra downward force F3, counteracting the first lifting force F1. When the total downward force (the first downward force F2 plus the extra downward force F3) is greater than the first lifting force F1, the first carrier C10 cannot be lifted off the first load port LP1 with the first lifting force F1 by the OHT vehicle 10. Since the first lifting force F1 is calculated to be the minimum force required for lifting the first carrier C10 based on the calculation of the control unit 15 and the design of the OHT vehicle 10, even a small extra downward force F3 can result in suspension of transportation of the first carrier C10.

In some embodiments, the method M10 or the method M20 further includes detecting whether the first carrier C10 is lifted by the first lifting force F1 after the first lifting force F1 is applied. In some embodiments, the OHT vehicle 10 includes a sensor 17, and the sensor 17 can detect if the first carrier C10 is not approaching the housing 10, or if the vertical distance between the OHT vehicle 10 and the first carrier C10 does not decrease, after the first lifting force F1 is applied. In some embodiments, the sensor 17 can be installed on the first load port LP1 to detect if the first carrier C10 is lifted off the first load port LP1. In some embodiments, the sensor 17 can be installed adjacent to the first load port LP1 or the first carrier C10 to detect a vertical movement of the first carrier C10. Different types of the sensor 17 can be applied according to different requirements, and is not limited herein.

As shown in FIG. 5, in some embodiments, the sensor 17 is electrically connected to the hoisting member 13 and the control unit 15, and detection of the status of the hoisting motor 131 and the belt 132 by the sensor 17 can facilitate determination of a lifting status of the first carrier C10 by the control unit 15. However, the disclosure is not limited thereto. As illustrated above, the sensor 17 can be installed on the first load port LP1 or adjacent to the first carrier C10. In some embodiments, the sensor 17 can be electrically connected to the control unit 15 without electrically connecting to the hoisting member 13.

In some embodiments, the method M10 or the method M20 can further include sending an alert if the first carrier C10 cannot be lifted with the first lifting force F1. An alert or a notification is sent to notify an operator that an abnormal circumstance exists or an error has occurred. A type of the alert or the notification is not limited herein. For instance, the alert or the notification can be a message appearing on a user interface or an alarm sounded in a factory, depending on different applications. In some embodiments, the method M10 or the method M20 can further include stopping application of the first lifting force F1 if the total downward force is greater than the first lifting force F1, for purposes of power saving and preventing damage to the workpieces SB, the first carrier C10, and/or the first load port LP1.

In some embodiments, the sensor 17 is electrically connected to the control unit 15 directly or indirectly (please refer to FIG. 5 for the electrical connection). When abnormal circumstances exist or errors occur, the sensor 17 sends a signal to the control unit 15. The control unit 15 can send a signal to stop the hoisting member 13 from providing the first lifting force F1 to the first carrier C10 until the abnormal circumstance or the error is eliminated or until an operator re-initiates the lifting operation. In some embodiments, the sensor 17 is electrically connected to a central system directly or indirectly to cause the central system to send the alert or the notification or sound the alarm.

Figure 11:
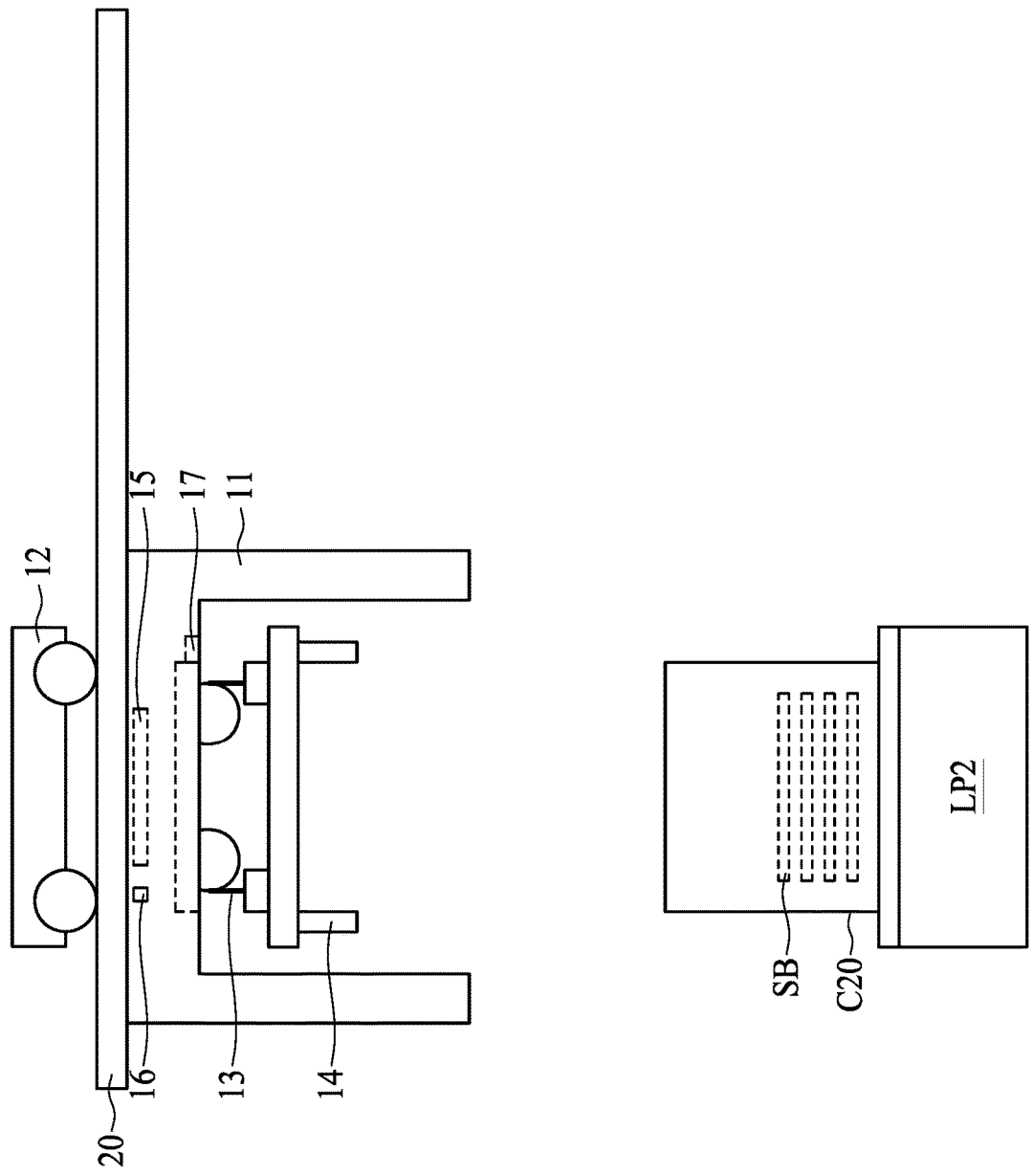

In some embodiments, the OHT vehicle 10 stops moving or moves back to a default position after transporting the first carrier C10. In some embodiments, as illustrated in the flow chart of FIG. 4, the OHT vehicle 10 may start to transport another second carrier C20. FIG. 11 is diagram showing the conveying system S10 in accordance with the operation O203, in which the OHT vehicle 10 is moved toward and positioned over a second load port LP2 of another machine station. In some embodiments, the travelling member 12 moves the OHT vehicle 10 toward the second load port LP2 according to the information from the second server SV2.

In some embodiments, the method M20 further includes extending the hoisting member 13 toward a second carrier C20 after the operation O203 and prior to the operation O204. The hoisting motor 131 actuates rotation of the wheels 132 to release the belt 133 in order to lower the gripping member 14 toward the second carrier C20.

Figure 12:
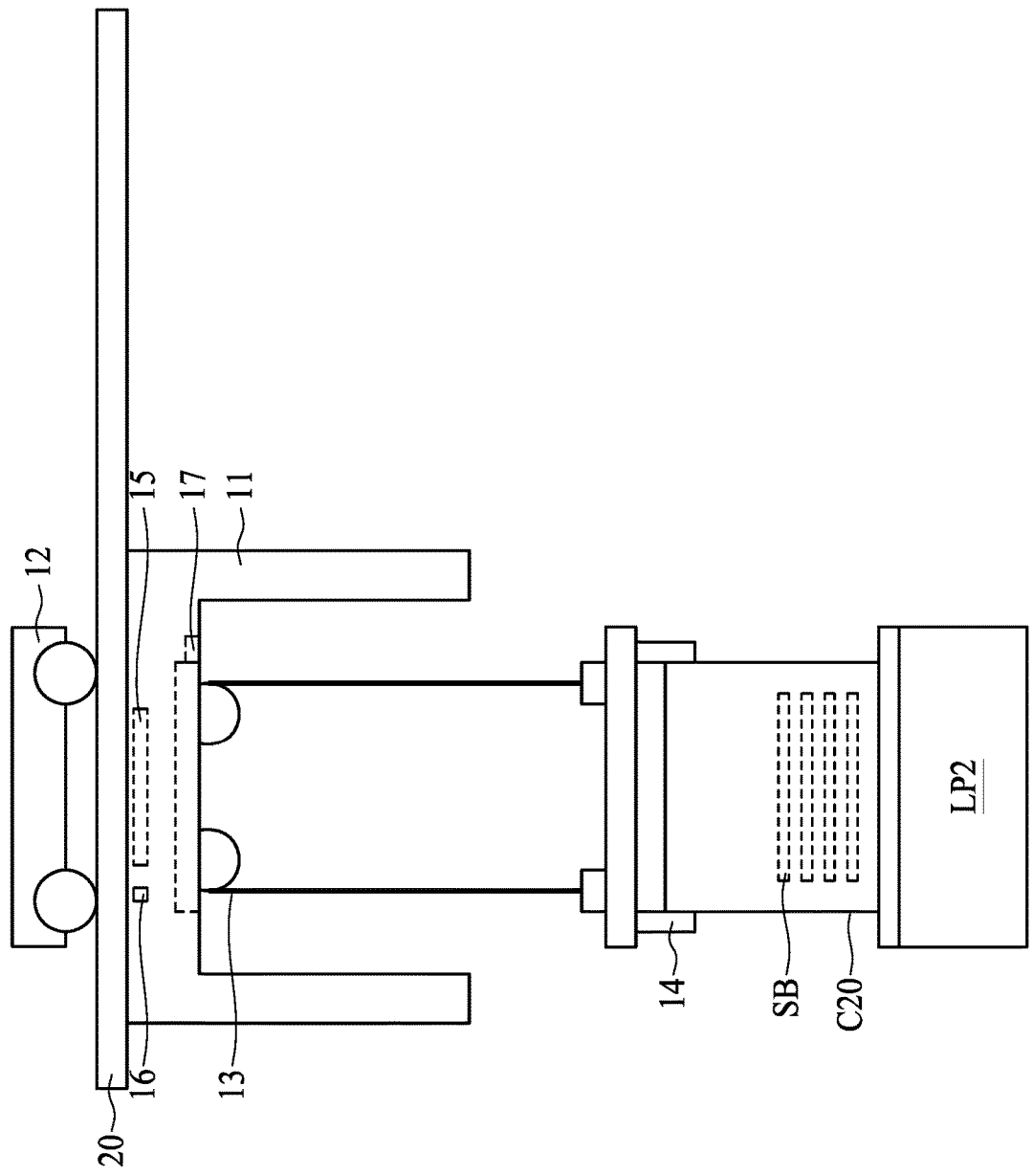

FIG. 12 is a diagram of the conveying system S10 in accordance with some embodiments after the operation O203 and prior to the operation O204. The method M20 can further include gripping the second carrier C20 by the gripping member 14. In some embodiments, the gripping member 14 applies forces from two opposite sides of the second carrier C20 in order to grip the second carrier C20. However, the disclosure is not limited thereto. As described above, the gripping member 14 can include a connector to connect a corresponding connector on the second carrier C20 depending on a type of the second carrier C20.

Figure 13:
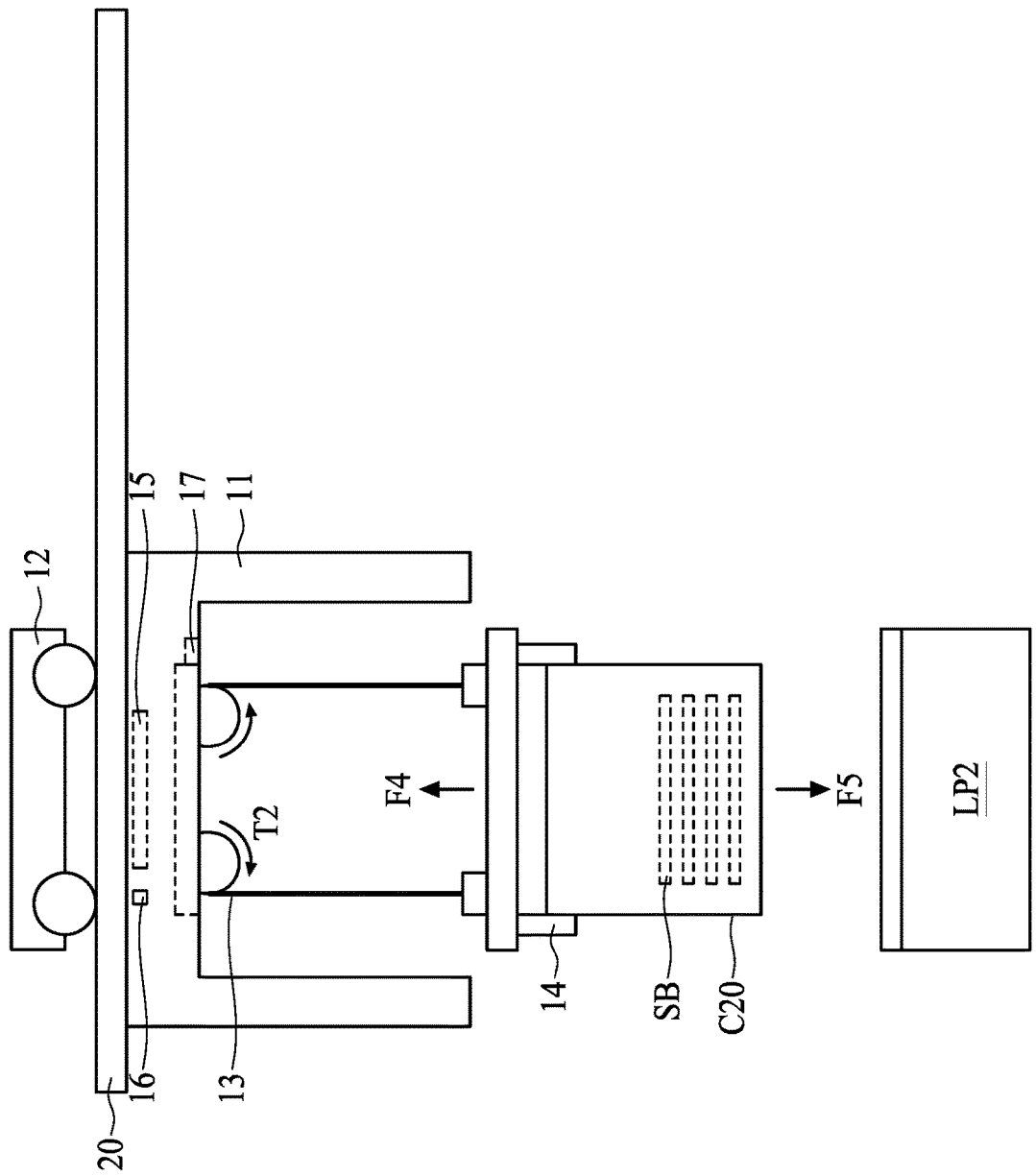
Figure 14:
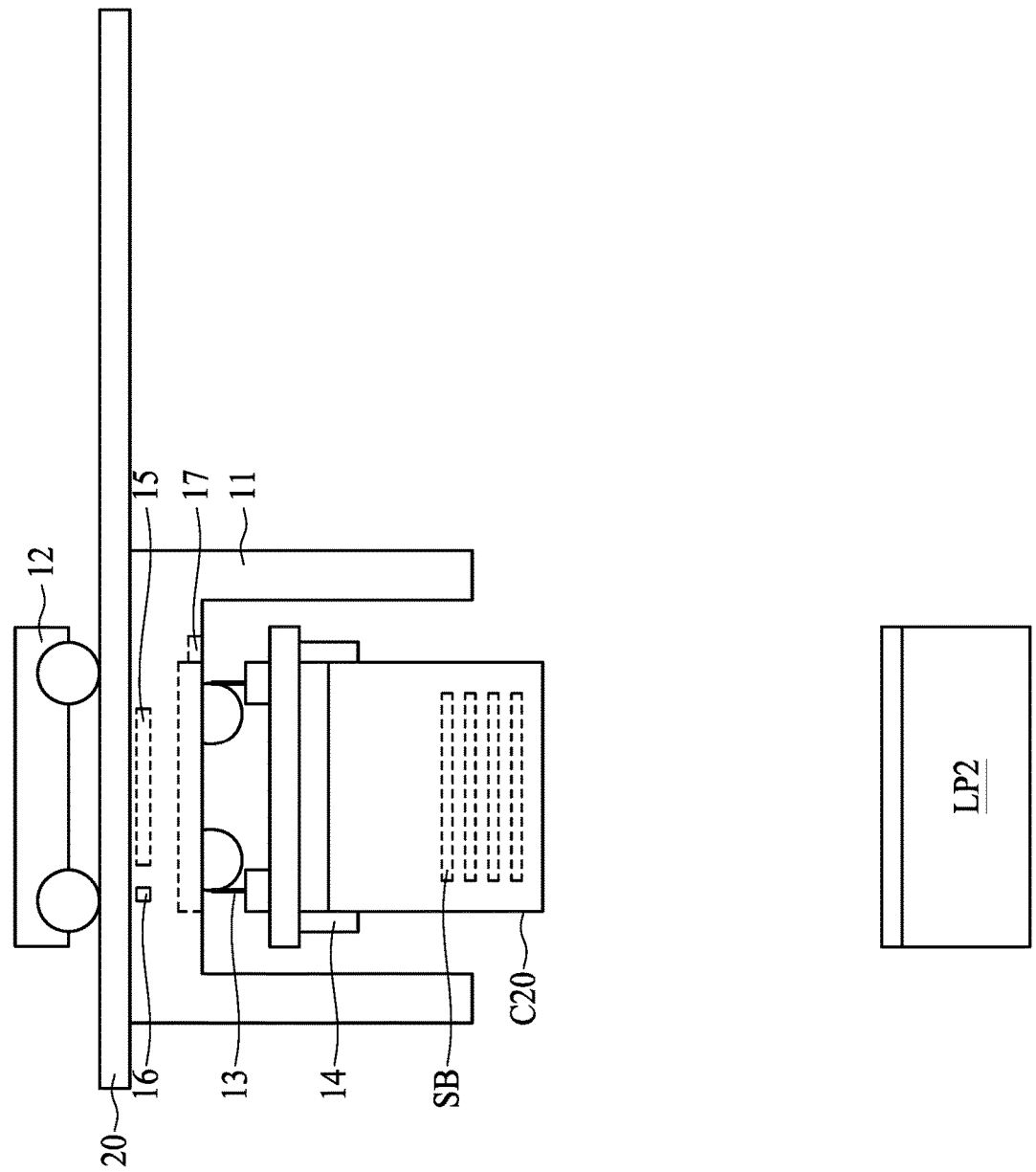

FIGS. 13 and 14 are diagrams of the conveying system S10 in accordance with some embodiments and the operation O204, wherein a second lifting force F4 is applied to the second carrier C20. A second torque T2 is generated by the hoisting motor 131 and is converted to the second lifting force F4 in order to apply an upward force to the second carrier C20 to lift the second carrier C20 from the second load port LP2. The second lifting force F4 is derived from the second torque T2, which is calculated by the control unit 15. The calculation of the second torque T2 and the second lifting force F4 is similar to the calculation of the first torque T1 and the first lifting force F1, and repeated description is omitted herein. Thus, in some embodiments, the method M20 further includes: determining the second lifting force F4 based on the data including at least one of the weight of the second carrier C20, the number of workpieces SB in the second carrier C20, and the vertical distance between the OHT vehicle 10 and the second carrier C20 prior to the operation O204.

After the second lifting force F4 is applied as illustrated in the operation O204, under normal circumstances, the second carrier C20 is lifted upward from the second load port LP2 with the second lifting force F4 as shown in FIGS. 13 and 14. The hoisting member 13 is retracted back to the housing 11, and the second carrier C20 is held by the gripping member 14 inside the housing 11 during transportation as shown in FIG. 14. Accordingly, the OHT vehicle 10 may receive a second downward force F5 from the second carrier C20 due to gravity. The second lifting force F4 is designed and calculated to be a minimum force required for lifting the second carrier C20, and is determined for a purpose of minimizing power consumption. The second downward force F5 should be substantially equal to a total weight of the second carrier C20 and the workpieces SB inside the second carrier C20, and the second lifting force F4 should be substantially equal to or slightly greater than the second downward force F5. Under normal circumstances, the second carrier C20 may then be transferred to a load port of another machine station.

It should be noted that different types of carriers can have different weights. Carriers on different load ports of different machine stations can contain different numbers of workpieces SB and/or different weights of workpieces SB. Moreover, a vertical distance between the OHT vehicle 10 and different carriers on different load ports can also be different, and it might result in different torques required to lift the different carriers. Therefore, the second lifting force F4 is be different from the first lifting force F1 if one factor of the information used in the calculation is different from that of information for lifting the first carrier C10. In some embodiments, the weight of the first carrier C10 is different from the weight of the second carrier C20, and therefore the first lifting force F1 would be different from the second lifting force F4. In other embodiments, the vertical distance between the OHT vehicle 10 and the second carrier C20 is different from the vertical distance between the OHT vehicle 10 and the first carrier C10, and therefore the second torque T2 would be different from the first torque T1.

Figure 15:
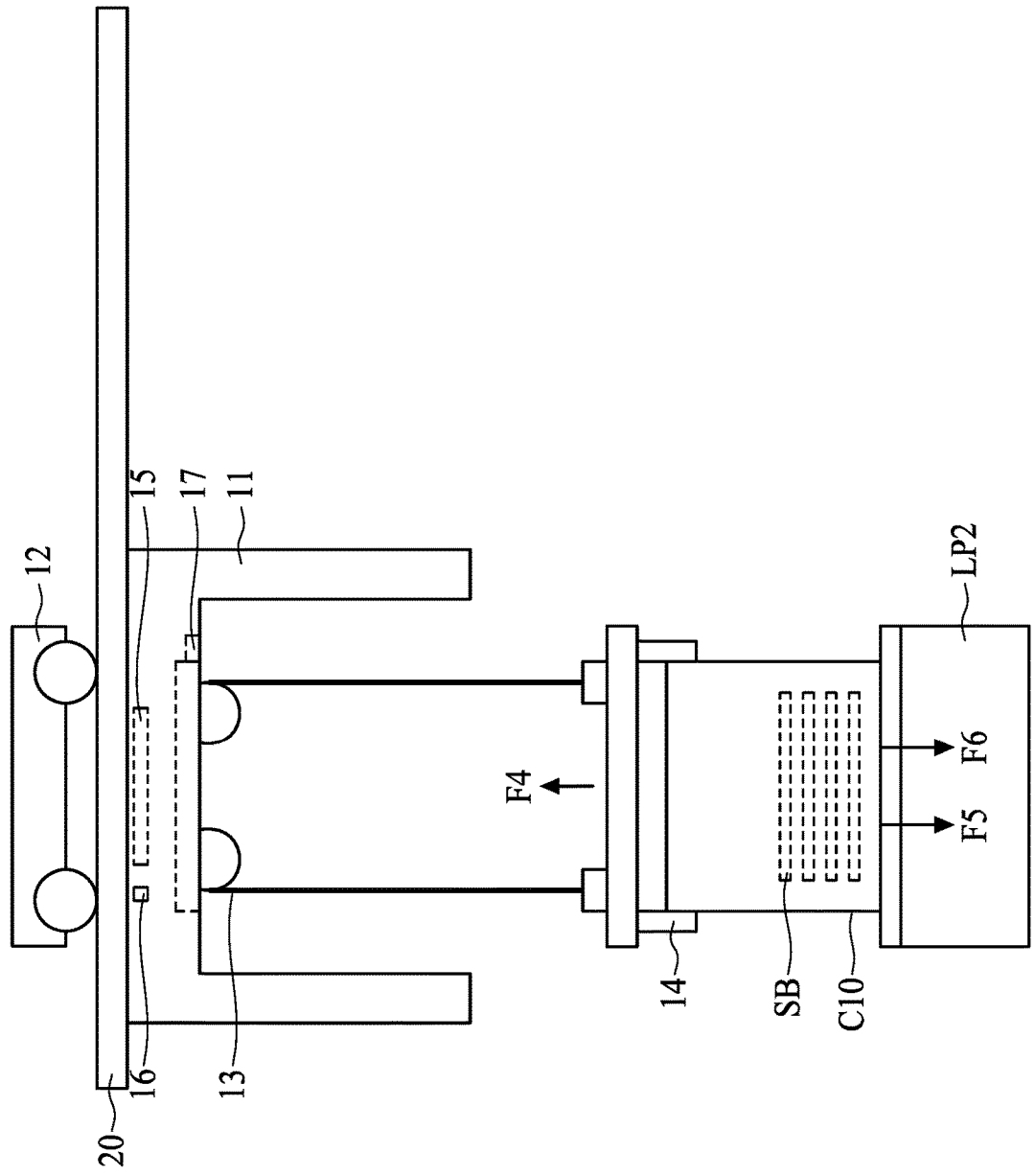

When an abnormal circumstance exists or an error occurs, the second carrier C20 may receive a second downward force F5 from the second load port LP2 as shown in FIG. 15, and the second carrier C20 may not be lifted with the second lifting force F4 applied by the hoisting member 13. FIG. 15 is a diagram of the conveying system S10 in accordance with some embodiments of the present disclosure. The second carrier C20 is locked to the second load port LP2 when it is disposed on the second load port LP2, and should be released prior to the applying of the second lifting force F4. However, if the second carrier C20 is not released normally or if the second lifting force F4 is applied prior to the release of the second carrier C20, an extra downward force F6 is applied to the second carrier C20, and the OHT vehicle 10 receives both the second downward force F5 and the extra downward force F6, counteracting the second lifting force F4. When the total downward force (the second downward force F5 plus the extra downward force F6) is greater than the second lifting force F4, the second carrier C20 cannot be lifted with the second lifting force F4 by the OHT vehicle 10. Since the second lifting force F4 is calculated to be the minimum force required for lifting the second carrier C20 based on the calculation of the control unit 15 and the design of the OHT vehicle 10, even a small extra downward force F6 can result in suspension of transportation of the second carrier C20.

In some embodiments, the method M20 further includes a detection operation to detect if the second carrier C20 is lifted by the second lifting force F4 after the second lifting force F4 is applied, as illustrated in accordance with the operation O204. The OHT vehicle 10 can include the sensor 17, or the sensor 17 can be installed on the second load port LP2 similar to the configuration described above. In some embodiments, the method M20 can further include lifting the second carrier C20 or sending a notification. The above-described sensor 17, detection operation, and types of notification can be also applied when an error occurs or an abnormal circumstance exists during the transportation of the second carrier C20, and repeated description is omitted herein.

Figure 16:
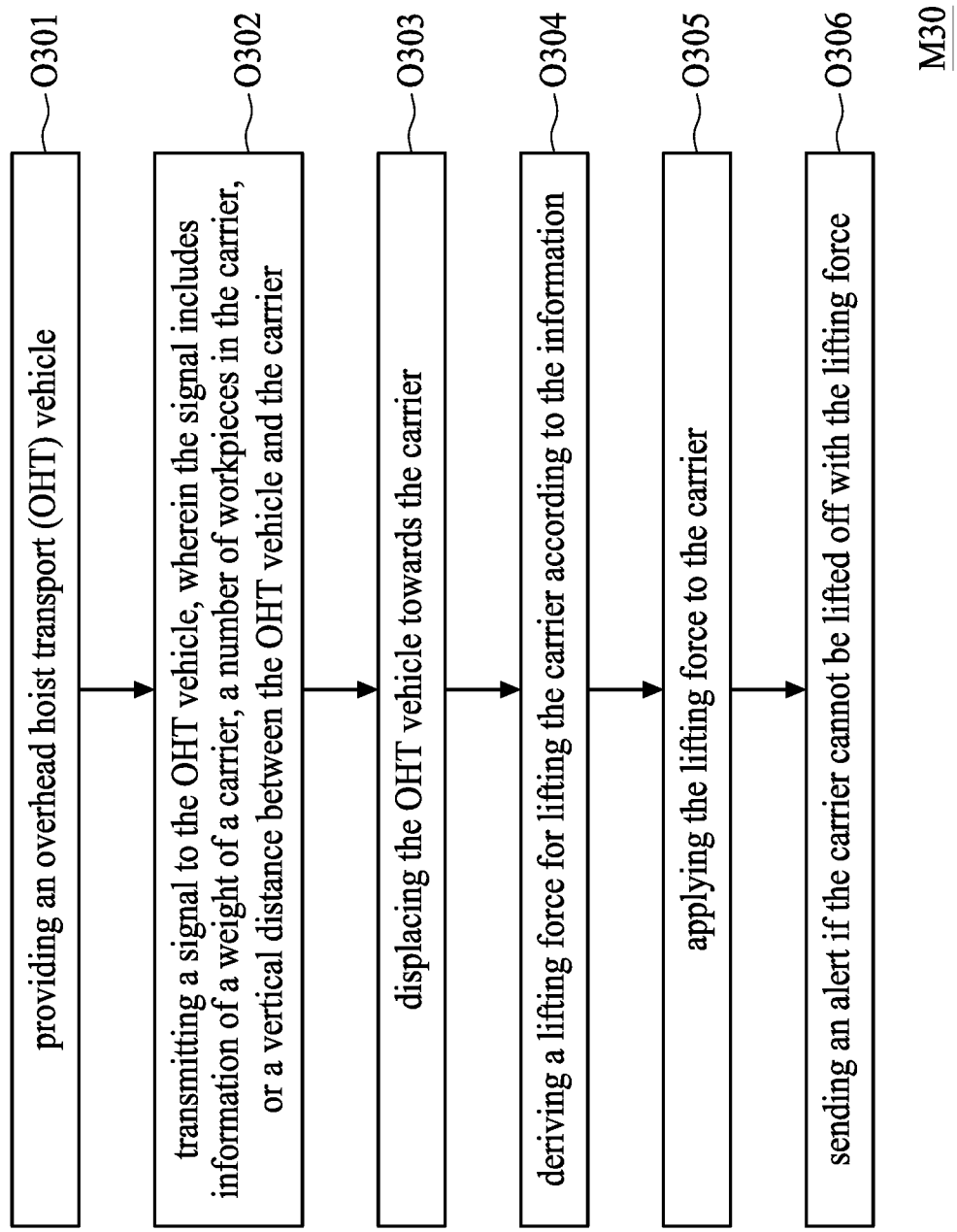
FIG. 16 is flow chart of a method for operating the conveying system in accordance with some embodiments of the methods shown in FIGS. 3 and 4.

In accordance with the above description, the present disclosure can prevent damage to the workpieces SB, the carriers C10 and C20, and the load ports LP1 and LP2 due to abnormal circumstances. FIG. 16 is a flow chart of a method M30 illustrating some embodiments of the method M10 or the M20 when an abnormal circumstance exists or an error occurs. The method M30 includes several operations: (O301) providing an overhead hoist transport (OHT) vehicle; (O302) transmitting a signal to the OHT vehicle, wherein the signal includes information of a weight of a carrier, a number of workpieces in the carrier, or a vertical distance between the OHT vehicle and the carrier; (O303) moving the OHT vehicle toward the carrier; (O304) determining a lifting force required for lifting the carrier according to the information; (O305) applying the lifting force to the carrier; and (O306) sending an alert if the carrier cannot be lifted with the lifting force.

The present disclosure provides a method for operating a conveying system including an automatic calculation and adjustment of a minimum force required to be applied to a carrier to lift the carrier. The minimum force can be calculated and determined from information of a weight of the carrier, a number of workpieces in the carrier, a weight of each of the workpieces, and a vertical distance between an overhead hoist transport (OHT) vehicle and the carrier. Minimum forces required to lift different carriers after different stages of the semiconductor fabrication can be different, and the conveying system of the present disclosure is able to adjust lifting forces applied to different carriers.

When an abnormal circumstance exists or an error occurs, an alert or a notification is sent to notify an operator of the situation. Therefore, damage to the semiconductor substrates, the workpieces, the carrier and the load port during the lifting process can be avoided.

Some embodiments of the disclosure provide a method for operating a conveying system. The method includes several operations. An overhead hoist transport (OHT) vehicle is provided, wherein the OHT vehicle includes a gripping member configured to grip and hold a carrier, and a receiver configured to receive a signal. The signal is transmitted to the receiver of the OHT vehicle. The OHT vehicle is moved toward the carrier, and the carrier is gripped by the gripping member of the OHT vehicle. A lifting force is determined based on a weight of a carrier, a number of workpieces in the carrier, or a vertical distance between the OHT vehicle and the carrier, and the lifting force is applied to the carrier.

Some embodiments of the disclosure provide a method for operating a conveying system. The method includes several operations. An overhead hoist transport (OHT) vehicle is positioned over a first load port, and a first lifting force is applied to a first carrier on the first load port. The OHT vehicle is positioned over a second load port, and a second lifting force is applied to a second carrier on the second load port, wherein the first lifting force is different from the second lifting force.

Some embodiments of the disclosure provide a method for operating a conveying system. The method includes several operations. An overhead hoist transport (OHT) vehicle is provided, wherein the OHT vehicle includes a gripping member configured to grip and hold a carrier, and a receiver configured to receive a signal. The signal is transmitted to the receiver of the OHT vehicle, wherein the signal includes information of a weight of a carrier, a number of workpieces in the carrier, or a vertical distance between the OHT vehicle and the carrier. The OHT vehicle is moved toward the carrier, and the carrier is gripped by the gripping member of the OHT vehicle. A lifting force is determined based on the information, and the lifting force is applied to the carrier. A notification is sent if the carrier cannot be lifted with the lifting force.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for operating a conveying system, comprising:
positioning an overhead hoist transport (OHT) vehicle over a first load port;
transmitting a first data to the OHT vehicle, wherein the first data includes information of a weight of a first carrier, a number of workpieces in the first carrier, and a first vertical distance between the OHT vehicle and the first carrier;

applying a first lifting force to the first carrier on the first load port, wherein the first lifting force is determined based on the first data;

moving the OHT vehicle over a second load port;

positioning the OHT vehicle over the second load port; and transmitting a second data to the OHT vehicle, wherein the second data includes information of a weight of a second carrier, a number of workpieces in the second carrier and a second vertical distance between the OHT vehicle and the second carrier;

applying a second lifting force to the second carrier on the second load port, wherein the second lifting force is determined based on the second data; and receiving the first data and the second data by a control unit of the OHT vehicle for automatic calculation prior to the application of the first lifting force and the second lifting force;

wherein the first lifting force is a minimum force required to lift the first carrier calculated by the control unit of the OHT vehicle, and the second lifting force is a minimum force required to lift the second carrier calculated by the control unit; and wherein the first lifting force is different from the second lifting force.

2. The method of claim 1, wherein the weight of the second carrier is different from the weight of the first carrier.

3. The method of claim 1, further comprising:

providing a first downward force subjecting to the first carrier;

sending a notification if the first downward force is greater than the first lifting force; and lifting the first carrier if the first downward force is equal to or less than the first lifting force.

4. The method of claim 3, further comprising:

stopping application of the first lifting force if the first downward force is greater than the first lifting force.

5. The method of claim 1, wherein the first lifting force is an upward force substantially equal to a first downward force of a total weight of the first carrier and the workpieces in the first carrier.

6. The method of claim 1, further comprising:

detecting whether the first carrier is lifted by the first lifting force after the application of the first lifting force.

7. The method of claim 6, wherein the detection is performed by a sensor disposed on the first load port.

8. The method of claim 6, wherein the detection is performed by another sensor disposed on the OHT vehicle.

9. The method of claim 1, further comprising:

calculating a first lifting torque according to the first weight of the first carrier, the first number of workpieces in the first carrier and the first vertical distance between the OHT vehicle and the first carrier;

generating the first lifting torque by a hoisting motor of a hoisting member of the OHT; and converting the first lifting torque to the first lifting force by a belt of the hoisting member connecting to the hoisting motor.

10. The method of claim 1, further comprising:

lifting the first carrier with the first lifting force; or sending an alert if the first carrier cannot be lifted with the first lifting force.

11. The method of claim 1, wherein the first data and the second data are wirelessly transmitted to the OHT vehicle.

12. The method of claim 1, further comprising:

detecting the first vertical distance between the OHT vehicle and the first carrier; and sending a notification if the first vertical distance does not decrease after the application of the first lifting force.

* * * * *